(12) United States Patent
Hsu

(10) Patent No.: US 6,777,804 B1
(45) Date of Patent: Aug. 17, 2004

(54) FLIP-CHIP PACKAGE SUBSTRATE

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/605,356

(22) Filed: Sep. 25, 2003

(30) Foreign Application Priority Data

Apr. 9, 2003 (TW) ...................................... 92205531 U

(51) Int. Cl.[7] .............................................. H01L 23/34
(52) U.S. Cl. ...................................... 257/725; 257/778
(58) Field of Search ................................ 257/723, 724, 257/725, 778; 438/108

(56) References Cited

U.S. PATENT DOCUMENTS

| 6,153,939 A | * | 11/2000 | Wang et al. | ................ | 257/778 |
| 6,348,399 B1 | * | 2/2002 | Lin | ............................ | 438/108 |
| 6,459,144 B1 | * | 10/2002 | Pu et al. | ..................... | 257/778 |
| 6,462,423 B1 | * | 10/2002 | Akram et al. | ............... | 257/778 |
| 6,656,768 B2 | * | 12/2003 | Thomas | ...................... | 438/108 |

* cited by examiner

Primary Examiner—Chandra Chaudhari
(74) Attorney, Agent, or Firm—Jiang Chyun IP Office

(57) ABSTRACT

A flip-chip package has a first surface and a corresponding second surface. The chip is adapted to be disposed on the first surface of the substrate and electrically connected to the substrate. The chip has a centerline, which evenly divides the chip into two equal parts. The substrate has a peripheral connection-pad layout region disposed on the second surface of the substrate. The peripheral connection-pad layout region has a centerline neighboring region which the centerline of the chip traverses. The substrate also has a plurality of central connection pads disposed in the centerline neighboring region. Within the centerline neighboring region, at both sides of the centerline of the chip is respectively lined with the central connection pads in three rows. The central connection pads in each row are lined in parallel to the direction extending the centerline. The ratio of the number of the central connection pads for transmitting signals to the total number of the central connection pads is equal to or less than $2/7$.

25 Claims, 10 Drawing Sheets

FLIP-CHIP PACKAGE SUBSTRATE

CROSS REFERENCE TO RELATED APPLICATIONS

This application claims the priority benefit of Taiwan application serial no. 92205531, filed Apr. 9, 2003.

BACKGROUND OF INVENTION

1. Field of Invention

The present invention relates to a package substrate, and more particularly, to a flip-chip package substrate having a better electrical performance.

2. Description of Related Art

High speed, high quality, and more versatile products are being pursued by current information society. Product appearance has developed along the trend of lighter, thinner, shorter, and smaller. The general electronic product has a semiconductor chip and a substrate connected to the semiconductor chip, and the semiconductor chip receives a signal from a motherboard or outside, or transmits the signal to the motherboard or outside via a transmission circuit of the substrate. Therefore, the signal transmission quality of the substrate significantly impacts the operation process of the semiconductor chip.

However, the signal transmission quality of the substrate is impacted by the circuit layout of the substrate as shown below. FIG. 1 schematically shows a sectional view of a conventional flip-chip package structure. FIG. 2 schematically shows a partial magnified top view of the substrate traces in FIG. 1. Referring to FIG. 1, the substrate 110 comprises a plurality of bump pads 112 and a plurality of solder-ball pads 122, wherein the bump pads 112 are disposed on a first surface 114 of the substrate 110, and the solder-ball pads 122 are disposed on a second surface 124 of the substrate 110. The bump pads 112 are electrically connected to the solder-ball pads 122 via an internal circuit (not shown) of the substrate 110. A chip 130 is joined to the bump pads 112 of the substrate 110 and electrically connected to the substrate 110 via multiple bumps 132. An underfill 140 is dispensed between the chip 130 and the substrate 110 so as to cover the bumps 132. Multiple solder balls 150 are disposed on the solder-ball pads 122. The substrate 110 is electrically connected to an external circuit (not shown) via the solder balls 150, so that the chip 130 can transmit signal to the external circuit.

Referring to both FIG. 1, and FIG. 2, the region on which the solder-ball pads are laid out is generally divided into a core solder-ball-pad layout region 126 and a peripheral solder-ball-pad layout region 128, wherein the core solder-ball-pad layout region 126 is disposed on the central area of the second surface 124 of the substrate 110. The solder-ball pad peripheral layout region 128 surrounds the periphery of the core solder-ball-pad layout region 126. Both the core solder-ball-pad layout region 126 and the peripheral solder-ball-pad layout region 128 have solder-ball pads 122 disposed on them. Generally speaking, the solder-ball pads, 122 disposed on the core solder-ball-pad layout region 126 are either used as the power/grounding or without any electrical function. The solder-ball pads 122 for transmitting signals (e.g. the solder-ball pads marked as "1" in FIG. 2), the solder-ball pads for connecting the power plane (e.g. the solder-ball pads marked as "2" in FIG. 2), the solder-ball pads for connecting the ground plane (e.g. the solder-ball pads marked as "3" in FIG. 2), and the solder-ball pads having no electrical function are randomly distributed on the peripheral solder-ball-pad layout region 128. As mentioned above, the solder-ball pads used for transmitting signals are all disposed on the peripheral solder-ball-pad layout region 128.

Referring to FIG. 2, the chip 130 transmits signals via the traces fanned out to the peripheral region of the substrate 110 and the traces inside the via holes 113. The bumps 112 are electrically connected to the solder-ball pads 122 for transmitting signals (e.g. the solder-ball pads marked as "1" in FIG. 2) via the traces 111 and the traces inside the via holes 113. The chip 130 has a centerline 134, which divides the chip 130 into two equal parts. Since the traces layout area neighboring the centerline 134 of the chip 130 is rather small, the traces (e.g. traces 111a, 111b, 111c, 111d, 111e, and 111f) neighboring the centerline 134 of the chip 130 have to extend in a rather long distance and parallelly to the centerline 134 of the chip 130. The pitch p between the neighboring traces 111a, 111b, 111c, 111d, 111e, and 111f in the parallel arranged section is too short, and if the signal is transmitted via the traces 111a, 111b, 111c, 111d, 111e, and 111f, more noise may be generated and the electrical performance is deteriorated.

SUMMARY OF INVENTION

It is one of the objects of the present invention to provide a substrate, in which a bigger pitch between the traces neighboring to the centerline of the chip is provided, so as to improve the electrical performance.

In order to achieve the object mentioned above, the substrate has a first surface and a corresponding second surface. The chip is adapted to be disposed on the first surface of the substrate and electrically connected to the substrate. The chip has a centerline, which evenly divides the chip into two equal parts. The substrate has a peripheral connection-pad layout region disposed on the second surface of the substrate. The peripheral connection-pad layout region has a centerline neighboring region which the centerline of the chip traverses. The substrate also has a plurality of central connection pads disposed in the centerline neighboring region.

In accordance with a preferred embodiment of the present invention, within the centerline neighboring region, at both sides of the centerline of the chip is respectively lined with the central connection pads in three rows. The central connection pads in each row are lined in parallel to the direction extending the centerline. The centerline traverses between the central connection pads arranged in two neighboring rows. The ratio of the number of the central connection pads for transmitting signals to the total number of the central connection pads is equal to or less than 2/7.

In accordance with a preferred embodiment of the present invention, within the centerline neighboring region, the central connection pads are lined in five rows. The central connection pads in each row are lined in parallel to the centerline. The centerline traverses the central connection pads arranged in a central row. The ratio of the number of the central connection pads for transmitting signals to the total number of the central connection pads is less than 2/7.

In summary, since the central connection pads for transmitting signals disposed in the centerline neighboring region are relatively few, the multiple traces neighboring the centerline of the chip do not extend in a rather long distance and parallelly to the centerline. Instead, they only extend parallelly in a short distance and then extend gradually increasing the pitch between the neighboring traces. Therefore, the cross-talk generated between the traces is reduced and the noise generated by signal transmission on the traces is also dramatically diminished.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION
The First Preferred Embodiment

Figure 1:
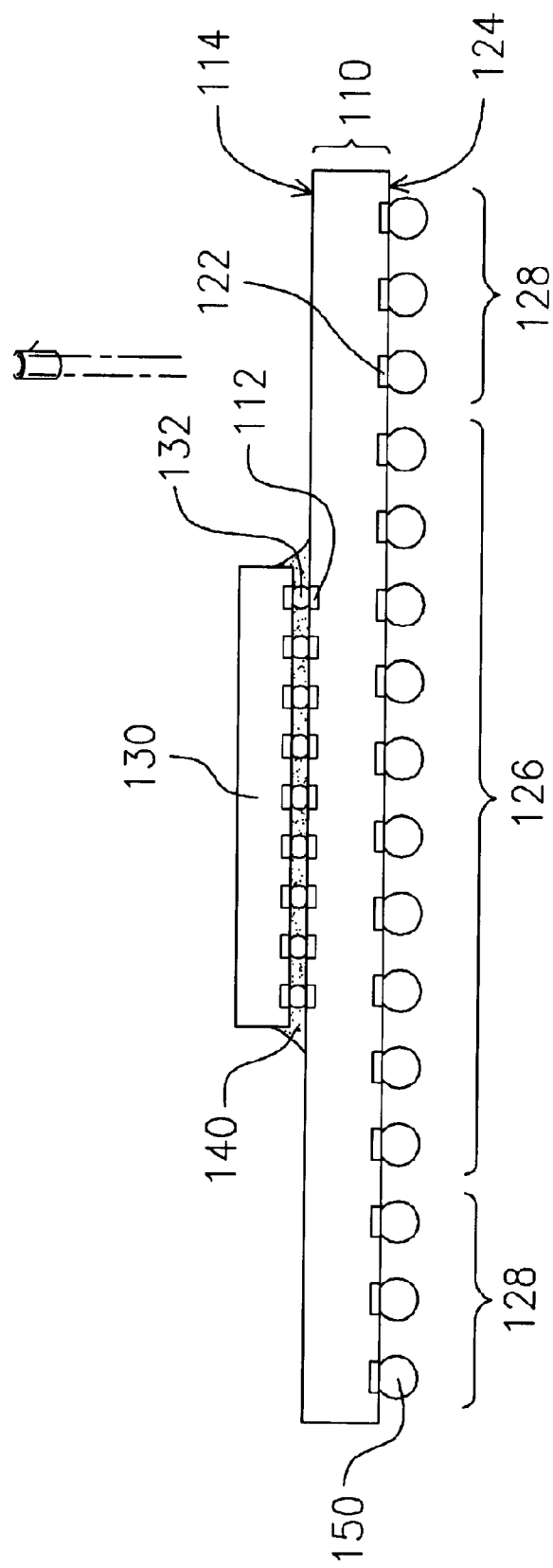
FIG. 1 schematically shows a sectional view of a conventional flip-chip package structure.
Figure 2:
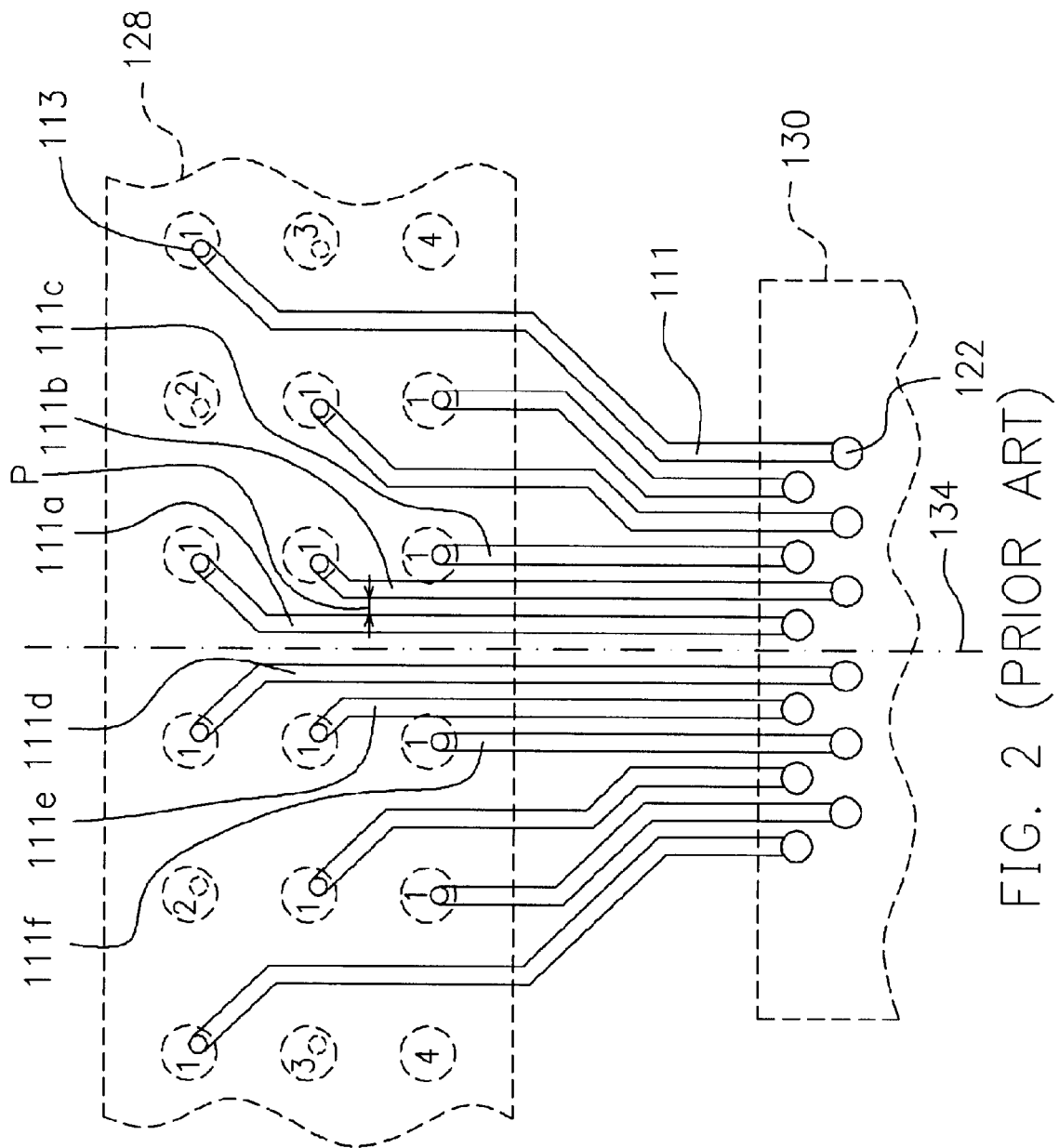
FIG. 2 schematically shows a partial magnified top view of the substrate traces in FIG. 1.
Figure 3:
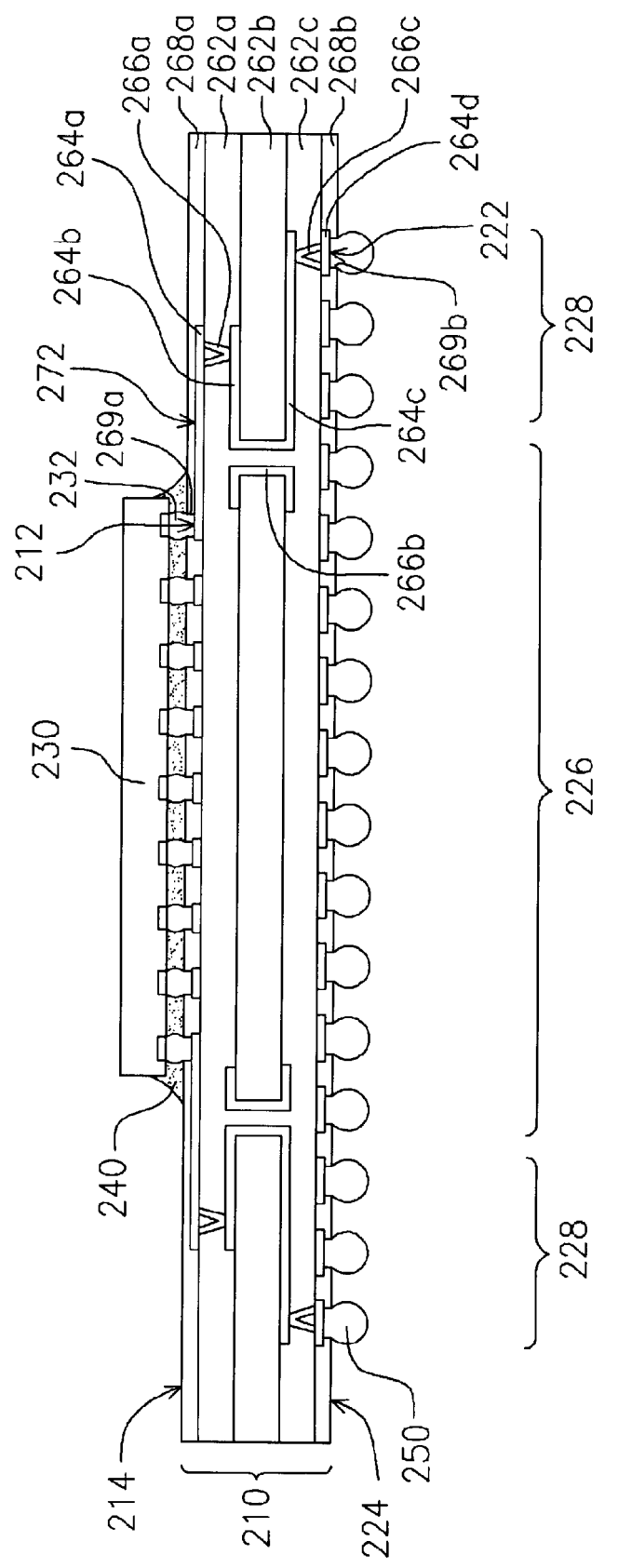
FIG. 3 schematically shows a sectional view of a flip-chip package structure of the first embodiment according to the present invention.

FIG. 3 schematically shows a sectional view of a flip-chip package structure of the first embodiment according to the present invention. The substrate 210 comprises a plurality of bump pads 212 and a plurality of connection pads 222, wherein the bump pads 212 are disposed on a first surface 214 of the substrate 210, and the connection pads 222 are disposed on a second surface 224 of the substrate 210. The bump pads 212 are electrically connected to the connection pads 222 via an internal circuit (not shown) of the substrate 210. A chip 230 is joined to the bump pads 212 of the substrate 210 and electrically connected to the substrate 210 via a plurality of bumps 232. An underfill 240 is dispensed between the chip 230 and the substrate 210 so as to cover the bumps 232. A plurality of contact points 250 are disposed on the connection pads 222, wherein the contact points 250 are an electrically conductive structure such as solder balls, pins, or electrode blocks, and the solder balls are exemplified in the present embodiment. The substrate 210 is electrically connected to an external circuit (not shown) via the contact points 250, so that the chip 230 can transmit signals to the external circuit.

The substrate 210 comprises, for example, three isolation layers 262a, 262b, 262c, four electrically conductive layers 264a, 264b, 264c, 264d, a plurality of via-hole traces 266a, 266b, 266c, and two solder masks 268a, 268b. The electrically conductive layers 264a, 264b, 264c, 264d are sequentially stacked with each other. The isolation layers 262a, 262b, 262c are disposed between two of the neighboring electrically conductive layers 264a, 264b, 264c, 264d, respectively to electrically isolate the electrically conductive layers 264a, 264b, 264c, 264d. The via-hole traces 266a, 266b, 266c penetrate at least one layer of the isolation layers 262a, 262b, 262c, so as to electrically connect to at least two layers of the electrically conductive layers 264a, 264b, 264c, 264d. The isolation layers 262a, 262b, 262c are made of a material such as the FR-4, FR-5, Bismaleimide-Triazine (BT), epoxy, polyimide, or ceramics, etc. The electrically conductive layers 264a, 264b, 264c, 264d are made of a material such as copper. The solder masks 268a, 268b are disposed on the isolation layers 262a, 262c and the electrically conductive layers 264a, 264d respectively, so as to protect the electrically conductive layers 264a, 264d. The solder mask 268a has a plurality of openings 269a, which respectively exposes the electrically conductive layer 264a to form the bump pads 212 and the bump pads 212 can join with the bumps 232. The solder mask 268b has a plurality of openings 269b, which respectively expose the electrically conductive layer 264d to form the connection pads 222 and the connection pads 222 can join with the contact points 250 such as the solder balls. As mentioned above, the bump pads 212 are formed by the electrically conductive layer 264a, which is nearest to the first surface 214 of the substrate 210, and the connection pads 222 are formed by the electrically conductive layer 264d, which is nearest to the second surface 224 of the substrate 210.

Although the four-layer board is exemplified in the preferred embodiments mentioned above, the present invention is not necessarily limited to it. Optionally, the substrate can be a six-layer board, an eight-layer board, or a multi-layer board with other number of electrically conductive layers.

Figure 4:
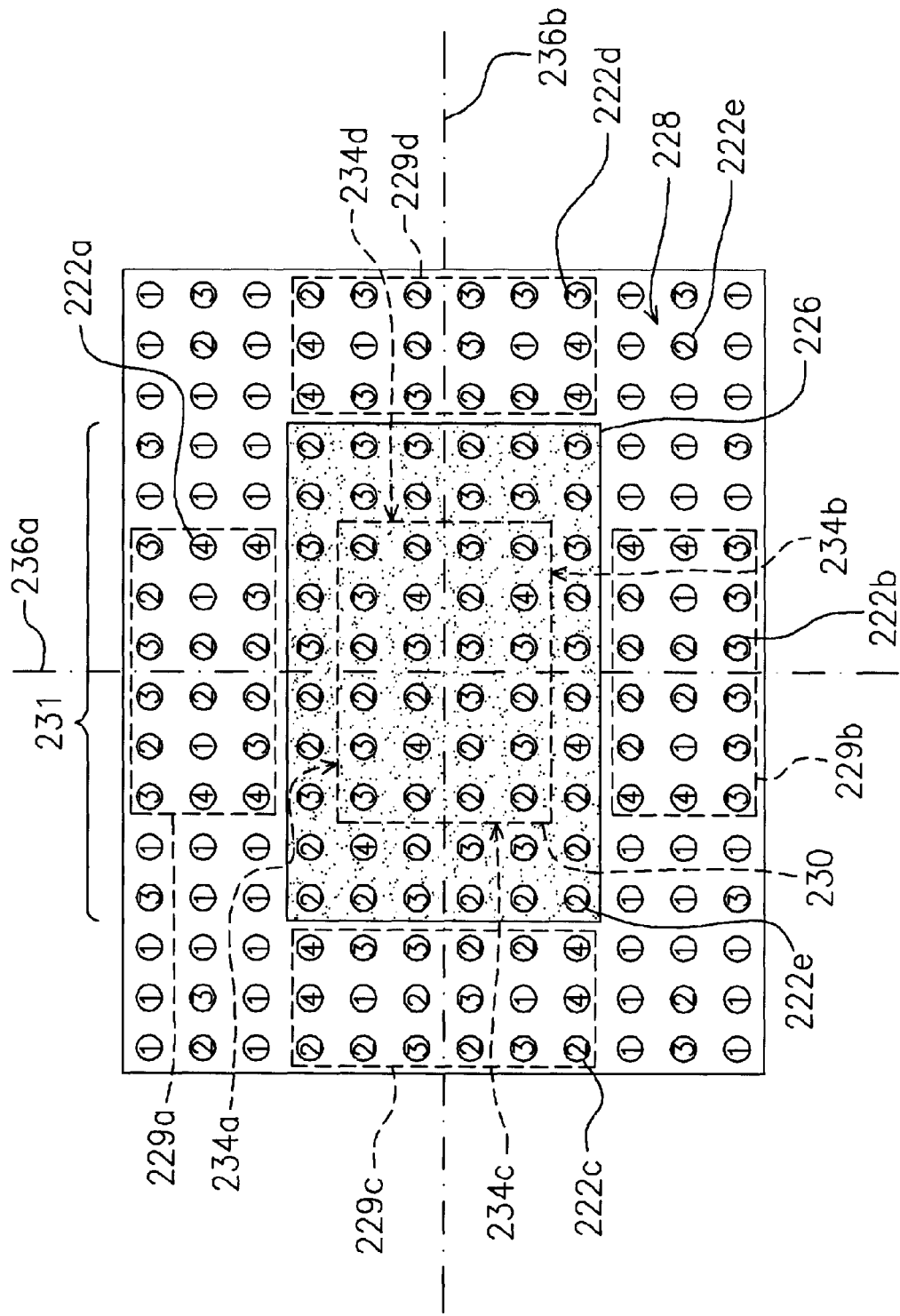
FIG. 4 schematically shows a bottom view of the layout of the substrate connection pads in FIG. 3 of the first embodiment according to the present invention.

FIG. 4 schematically shows a bottom view of the layout of the substrate connection pads in FIG. 3 of the first embodiment according to the present invention. The substrate 210 comprises a core connection-pad layout region 226 (e.g. the dotted region in the center of FIG. 4) and a peripheral connection-pad layout region 228 (e.g. the non-dotted region in the periphery of FIG. 4), both of them are disposed on the second surface 224 of the substrate 210. The peripheral connection-pad layout region 228 surrounds the core connection-pad layout region 226. In the present embodiment, the core connection-pad layout region 226 is contiguous to the peripheral connection-pad layout region 228.

The area surrounded by the dotted line on the second surface 224 of the substrate 210 is the area projected by the chip 230 disposed on the first surface 214 of the substrate 210. The chip 230 comprises two first opposite sides 234a, 234b, two second opposite sides 234c, 234d, a first centerline 236a and a second centerline 236b. The first centerline 236a perpendicularly and equally divides the first opposite sides 234a, 234b, and the second centerline 236b perpendicularly and equally divides the second opposite sides 234c, 234d.

The peripheral connection-pad layout region 228 comprises a first centerline neighboring region 229a, a second centerline neighboring region 229b, a third centerline neighboring region 229c, and a fourth centerline neighboring region 229d. The first centerline neighboring region 229a and the second centerline neighboring region 229b are disposed at two corresponding opposite sides of the chip 230 and close to the first opposite sides 234a, 234b of the chip 230, respectively. The third centerline neighboring region 229c and the fourth centerline neighboring region 229d are disposed on the other two corresponding sides of the chip 230 and close to the second opposite sides 234c, 234d of the chip 230, respectively. The first centerline 236a of the chip 230 passes through the first centerline neighboring region 229a and the second centerline neighboring region 229b, and the second centerline 236b of the chip 230 passes through the third centerline neighboring region 229c and the fourth centerline neighboring region 229d.

For clear description, the connection pads 222 on the second surface 224 of the substrate 210 are divided into a plurality of first central connection pads 222a, a plurality of second central connection pads 222b, a plurality of third central connection pads 222c, a plurality of fourth central connection pads 222d, and a plurality of common connection pads 222e. Part of the common connection pads 222e are disposed in the core connection-pad layout region 226, and the other part of the common connection pads 222e are disposed in the peripheral connection-pad layout region 228 and far way from the first centerline 236a and the second centerline 236b of the chip 230. The first central connection pads 222a are disposed in the first centerline neighboring region 229a, the second central connection pads 222b are disposed in the second centerline neighboring region 229b, the third central connection pads 222c are disposed in the third centerline neighboring region 229c, and the fourth central connection pads 222d are disposed in the fourth centerline neighboring region 229d.

Further, the connection pads 222 can be used to transmit signals, e.g. the connection pads marked as "1" in FIG. 4; the connection pads 222 also can be electrically connected with the power plane (not shown) and act as power connection pads, e.g. the connection pads marked as "2" in FIG. 4; the connection pads 222 also can be electrically connected with the ground plane (not shown) and act as ground connection pads, e.g. the connection pads marked as "3" in FIG. 4; the connection pads 222 also can be the connection pads having no electrical function, e.g. the connection pads marked as "4" in FIG. 4. Generally speaking, all of the common connection pads 222e disposed in the core connection-pad layout region 226 don't have a signal transmission function, or at least 90% of them don't have a signal transmission function.

Referring to FIG. 4, in the first centerline neighboring region 229a and in the second centerline neighboring region 229b, three rows of the first central connection pads 222a and three rows of the second connection pads 222b are lined at both sides of the first centerline 236a, respectively and in a direction parallel to the first centerline 236a. The first centerline 236a traverses between two neighboring rows of the first central connection pads 222a and the second central connection pads 222b. The ratio of the number of the first central connection pads 222a (marked as "1") for transmitting signals to the total number of the first central connection pads 222a is equal to or less than 2/7, and the ratio of the number of the second central connection pads 222b (mark as "1") for transmitting signals to the total number of the second central connection pads 222b is equal to or less than 2/7.

Further, in the third centerline neighboring region 229c and in the fourth central connection pads 222d, three rows of the third central connection pads 222c and three rows of the fourth connection pads 222d are lined at both sides of the second centerline 236b, respectively and in a direction parallel to the second centerline 236b. The second centerline 236b traverses between two neighboring rows of the third central connection pads 222c and the fourth central connection pads 222d. The ratio of the number of the third central connection pads 222c (marked as "1") for transmitting signals to the total number of the third central connection pads 222c is equal to or less than 2/7, and the ratio of the number of the fourth central connection pads 222d (mark as "1") for transmitting signals to the total number of the fourth central connection pads 222d is equal to or less than 2/7.

Referring to both FIG. 3 and FIG. 4, since the connection pads 222 for transmitting signals are all disposed in the peripheral connection-pad layout region 228, the chip 230 transmits signals via the trace 272 fanned out to the peripheral region of the substrate 210. As shown in FIG. 3, the trace 272 connected to the bump pad 212 is electrically connected to the-electrically conductive layer 264b via the via-hole trace 266a. The trace of the electrically conductive layer 264b is electrically connected to the electrically conductive layer 264c via the via-hole trace 266b. The trace of the electrically conductive layer 264c is electrically connected to the electrically conductive layer 264d via the via-hole trace 266c. Therefore, the bump pad 212 is electrically connected to the connection pad 222 (marked as "1") for signal transmission.

Figure 5:
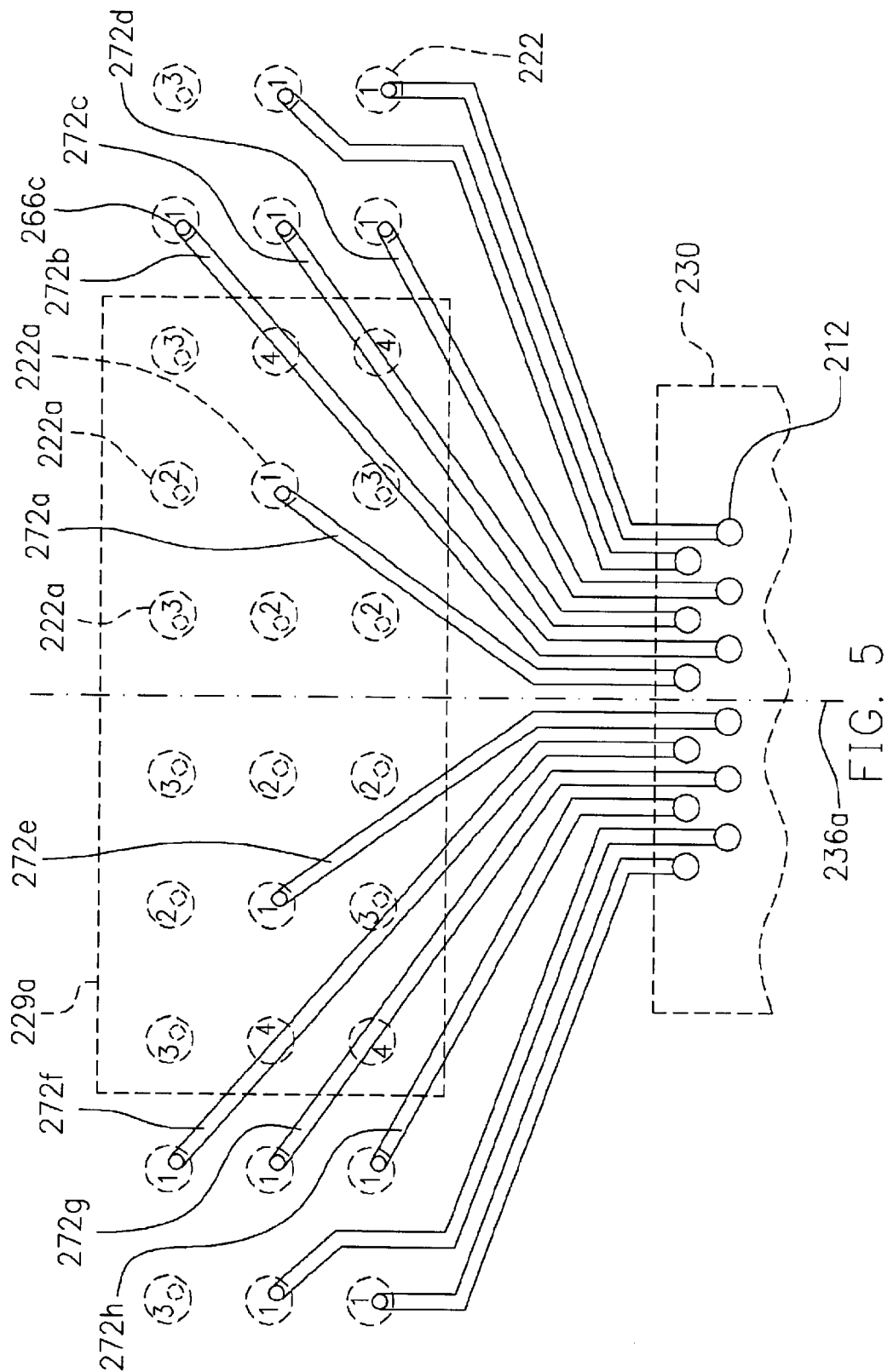
FIG. 5 schematically shows a partial magnified top view of the substrate traces in FIG. 3 of the first embodiment according to the present invention, wherein the location of the connection pads corresponds to the connection pads in the partial region 231 of the peripheral connection-pad layout region as shown in FIG. 4.

Referring to FIG. 5, the first central connection pads 222a (marked as "1") for signal transmission disposed in the first centerline neighboring region 229a are relatively few, and the ratio of its number to the total number of the first central connection pads 222a is equal to or less than 2/7. Therefore, the multiple traces 272a, 272b, 272c, 272d, 272e, 272f, 272g, 272h neighboring the first centerline 236a of the chip 230 do not extend in a rather long distance and parallelly to the first centerline 236a. Instead, they only extend parallelly in a rather short distance and then extend with gradually increasing the pitch between the neighboring traces 272a, 272b, 272c, 272d, 272e, 272f, 272g, 272h. Accordingly, the cross-talk generated between the traces 272a, 272b, 272c, 272d, 272e, 272f, 272g, 272h is reduced and the noise generated by the signal transmission on the traces 272a, 272b, 272c, 272d, 272e, 272f, 272g, 272h is also dramatically diminished.

Figure 6:
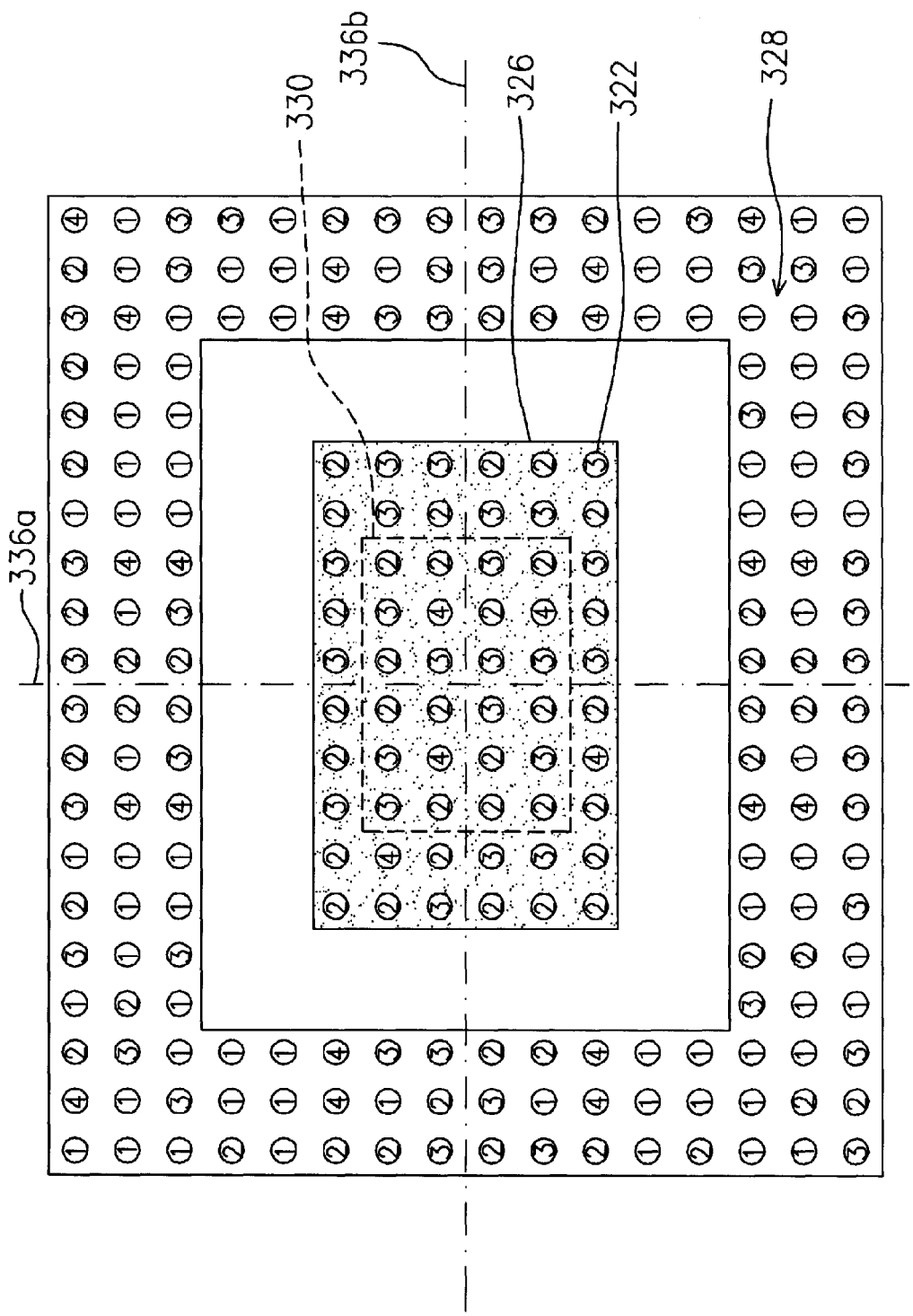
FIG. 6 schematically shows a different layout diagram of the substrate connection pads of the first embodiment according to the present invention.

Although the core connection-pad layout region is contiguous to the peripheral connection-pad layout region in the first preferred embodiments mentioned above, the present invention is not necessarily limited to it. FIG. 6 schematically shows a different layout diagram of the substrate connection pads of the first embodiment according to the present invention, wherein the core connection-pad layout region 326 (e.g. the dotted region in the center of FIG. 6) is apart from the peripheral connection-pad layout region 328 (e.g. the non-dotted region in the periphery of the FIG. 6) by a certain distance. Generally speaking, all of the connection pads 322 disposed on the core connection-pad layout region 326 don't have a signal transmission function, or at least 90% of them don't have a signal transmission function. Further, there are connection pads disposed on the four sides of the peripheral connection-pad layout region 328 and in the neighborhood of the centerline 336a, 336b of the chip 330 as described in the first preferred embodiment mentioned above, so the details is omitted herein.

In the above description of the first embodiment, each central padable area in centerline neighboring region has a connection pad for jointing with one of the contact points, wherein "padable area" is defined as the area where a connection pad is disposed or where no connection pad is disposed but a connection pad can be disposed. However, the present invention is not necessarily limited to the above disclosure.

Figure 7:
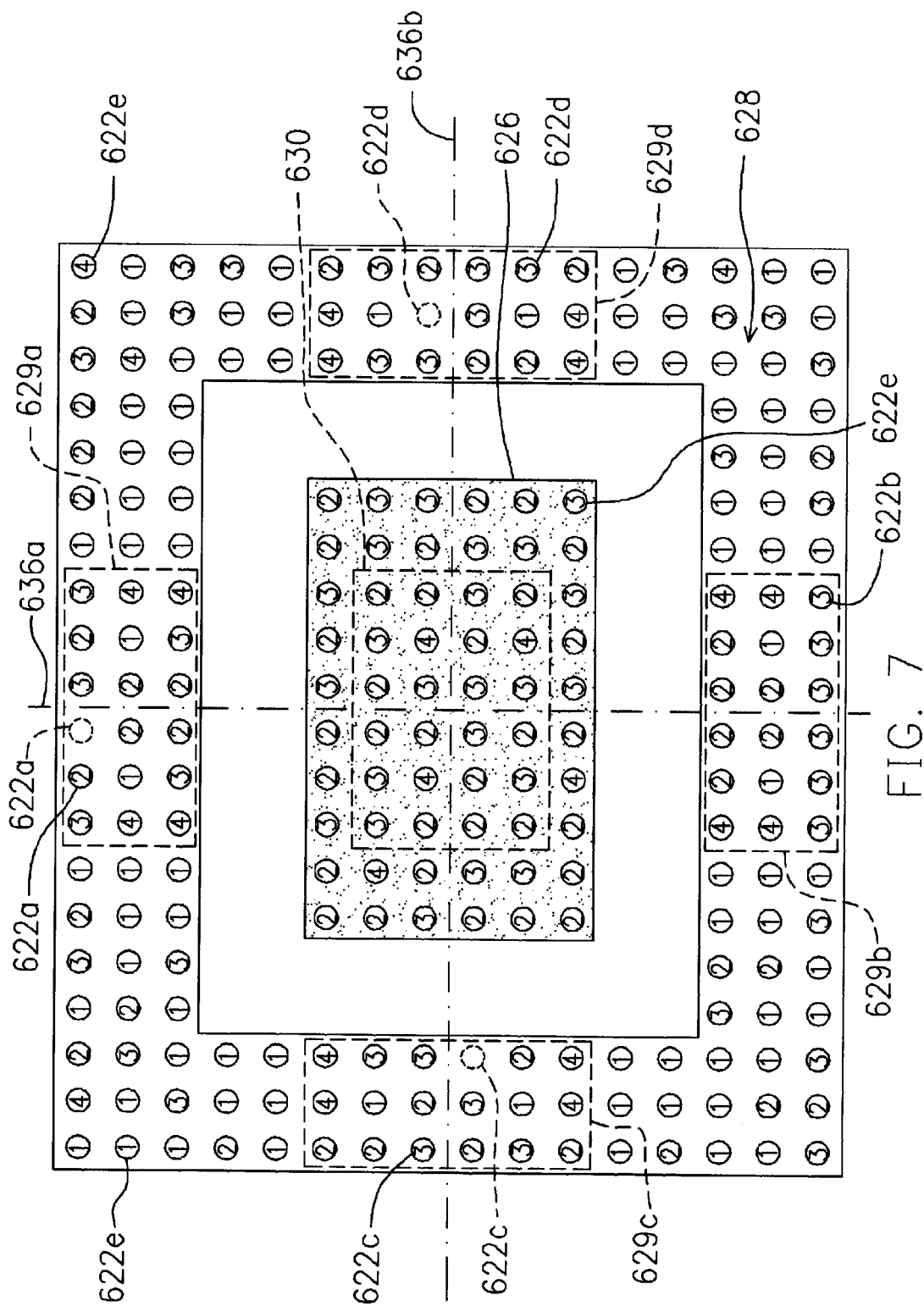
FIG. 7 schematically shows a different layout diagram of the substrate connection pads of the first embodiment according to the present invention, wherein there is no connection pad at some padable areas.

FIG. 7 schematically shows a different layout diagram of the substrate connection pads of the first embodiment according to the present invention, wherein there is no connection pad at some padable areas. Some padable areas 622 are defined by some connection pads for transmit signals, e.g. the padable areas marked as "1" in FIG. 7. Some padable areas 622 are defined by some connection pads electrically connected with the power plane (not shown), e.g. the padable areas 622 marked as "2" in FIG. 7. Some padable areas 622 are defined by some connection pads electrically connected with the ground plane (not shown), e.g. the padable areas marked as "3" in FIG. 7. Some padable areas 622 are defined by some connection pads having no electrical function, e.g. the padable areas marked as "4" in FIG. 7. It should be noted that there are no connection pads disposed at some padable areas 622, e.g. the padable areas 622 marked as the dotted-line circles in FIG. 7, but the padable areas 622 also can be defined by some connection pads.

For clear description, the padable areas 622 on a surface of the substrate 610 are divided into a plurality of first central padable areas 622a, a plurality of second central padable areas 622b, a plurality of third central padable areas 622c, a plurality of fourth central padable areas 622d, and a plurality of common padable areas 622e. Part of the common padable areas 622e are located in the core connection-pad layout region 626, and the other part of the common padable areas 222e are located in the peripheral connection-pad layout region 628 and far way from the first centerline 636a and the second centerline 636b of the chip 630. The first central padable areas 622a are disposed in the first centerline neighboring region 629a, the second central padable areas 622b are disposed in the second centerline neighboring region 629b, the third central padable areas 622c are disposed in the third centerline neighboring region 629c, and the fourth central padable areas 622d are disposed in the fourth centerline neighboring region 629d.

Within the centerline neighboring region 629a, 629b, at both sides of the centerline 636a of the chip 630 is respectively lined with the central padable areas 622a, 622b in three rows. The central padable areas 622a, 622b in each row are lined in parallel to the centerline 636a. The centerline 636a traverses between the central padable areas 622a, 622b arranged in two neighboring rows. The ratio of the number of the central padable areas 622a (marked as "1") with the connection pads for transmitting signals to the total number of the central padable areas 622a is equal to or less than $2/7$. The ratio of the number of the central padable areas 622b (marked as "1") with the connection pads for transmitting signals to the total number of the central padable areas 622b is equal to or less than $2/7$.

Within the centerline neighboring region 629c, 629d, at both sides of the centerline 636b of the chip 630 is respectively lined with the central padable areas 622c, 622d in three rows. The central padable areas 622c, 622d in each row are lined in parallel to the centerline 636b. The centerline 636b traverses between the central padable areas 622c, 622d arranged in two neighboring rows. The ratio of the number of the central padable areas 622c (marked as "1") with the connection pads for transmitting signals to the total number of the central padable areas 622c is equal to or less than $2/7$. The ratio of the number of the central padable areas 622d (marked as "1") with the connection pads for transmitting signals to the total number of the central padable areas 622d is equal to or less than $2/7$.

The Second Preferred Embodiment

Figure 8:
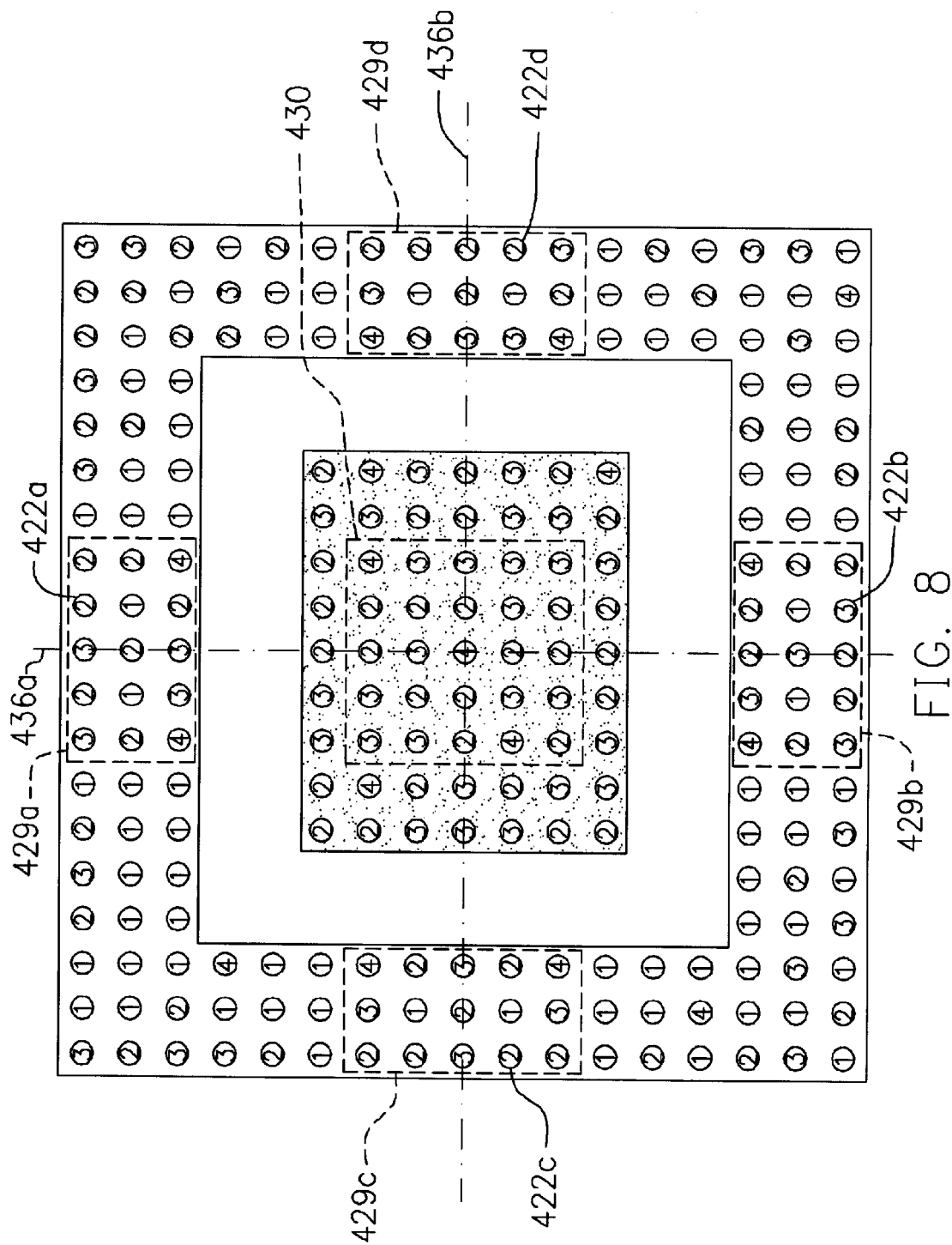
FIG. 8 schematically shows a layout diagram of the substrate connection pads of the second embodiment according to the present invention.

In the first preferred embodiment of the present invention mentioned above, within the peripheral connection-pad layout region, three rows of the central connection pads are disposed at both sides of the centerline of the chip. The centerline passes between two neighboring rows of the central connection pads. In one of the centerline neighboring regions, the ratio of the number of the central connection pads for transmitting signals to the total number of the central connection pads is equal to or less than $2/7$. However, the present invention is not necessarily limited to this. FIG. 8 schematically shows a layout diagram of the substrate connection pads of the second embodiment according to the present invention, wherein five rows of the first central connection pads 422a and five rows of the second central connection pads 422b are lined in the first centerline neighboring region 429a and the second centerline neighboring region 429b, respectively and in a direction parallel to the first centerline 436a of the chip 430. The first centerline 436a traverses the first central connection pads 422a and the second connection pads 422b disposed on a central row. The ratio of the number of the first central connection pads 422a (marked as "1") for transmitting signals to the total number of the first central connection pads 422a is equal to or less than $2/7$, and the ratio of the number of the second central connection pads 422b (mark as "1") for transmitting signals to the total number of the second central connection pads 422b is equal to or less than $2/7$.

Five rows of the third central connection pads 422c and five rows of the fourth connection pads 422d are lined in the third centerline neighboring region 429c and in the fourth centerline neighboring region 429d, respectively and in a direction parallel to the second centerline 436b of the chip 430. The second centerline 436b traverses the third central connection pads 422c and the fourth connection pads 422d disposed on a central row. The ratio of the number of the third central connection pads 422c (marked as "1") for transmitting signals to the total number of the third central connection pads 422c is equal to or less than $2/7$, and the ratio of the number of the fourth central connection pads 422d (mark as "1") for transmitting signals to the total number of the fourth central connection pads 422d is equal to or less than $2/7$.

The central connection pads 422a (marked as "1"), 422b (marked as "1"), 422c (marked as "1"), and 422d (marked as "1") for signal transmission disposed in the centerline neighboring region 429a, 429b, 429c, and 429d are relatively few. Therefore, the multiple traces neighboring the centerline 436a, 436b of the chip 430 do not extend in a rather long distance and parallelly to the centerline 436a, 436b. Instead, they only extend parallelly in a short distance and then extend with gradually increasing the pitch between the neighboring traces. Accordingly, the cross-talk generated between the traces is reduced and the noise generated by signal transmission on the traces is also dramatically diminished.

In the above description of the second embodiment, each central padable area in centerline neighboring region has a connection pad for jointing with one of the contact points, wherein "padable area" is defined as the area where a connection pad is disposed or where no connection pad is disposed but a connection pad can be disposed. However, the present invention is not necessarily limited to the above disclosure.

Figure 9:
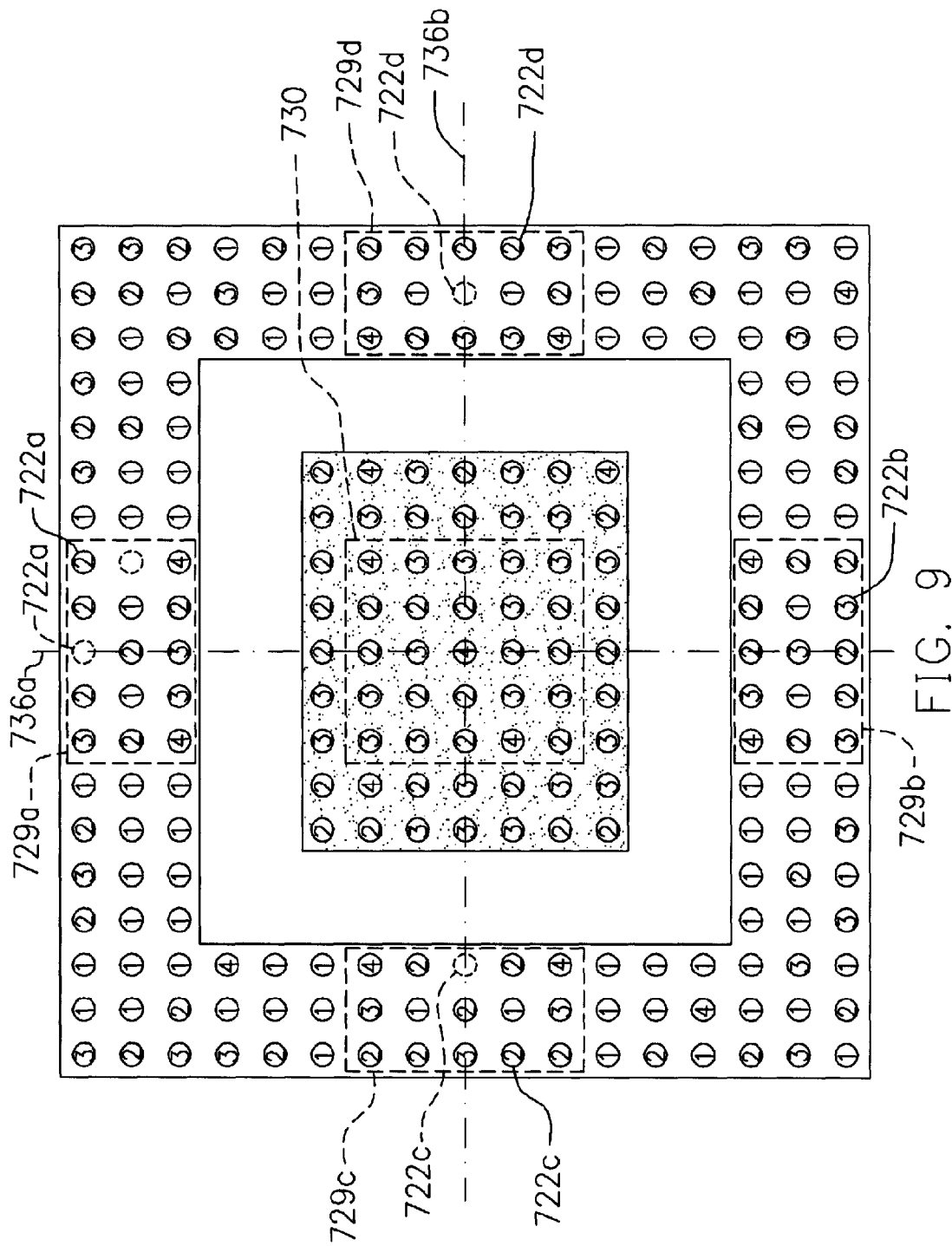
FIG. 9 schematically shows a different layout diagram of the substrate connection pads of the second embodiment according to the present invention.

FIG. 9 schematically shows a different layout diagram of the substrate connection pads of the second embodiment according to the present invention. Some padable areas 722 are defined by connection pads, e.g. the padable areas 722 marked as the solid-line circles in FIG. 9. However, it should be noted that there are no connection pads disposed at some padable areas 722, e.g. the padable areas 722 marked as the dotted-line circles in FIG. 9, but the padable areas 722 also can be defined by some connection pads.

Within the centerline neighboring regions 729a, 729b is lined with the central padable areas 722a, 722b in five rows, respectively. The central padable areas 722a, 722b are lined in parallel to the centerline 736a of the chip 730, wherein the centerline 736a traverses the central padable areas 722a, 722b arranged in a central row. The ratio of the number of the central padable areas 722a (marked as "1") with the connection pads for transmitting signals to the total number of the central padable areas 722a is either equal to or less than $2/7$. The ratio of the number of the central padable areas 722b (marked as "1") with the connection pads for transmitting signals to the total number of the central padable areas 722b is either equal to or less than $2/7$.

Within the centerline neighboring regions 729c, 729d is lined with the central padable areas 722c, 722d in five rows, respectively. The central padable areas 722c, 722d are lined in parallel to the centerline 736b of the chip 730, wherein the centerline 736b traverses the central padable areas 722c, 722d arranged in a central row. The ratio of the number of the central padable areas 722c (marked as "1") with the connection pads for transmitting signals to the total number of the central padable areas 722c is either equal to or less than $2/7$. The ratio of the number of the central padable areas 722d (marked as "1") with the connection pads for transmitting signals to the total number of the central padable areas 722d is either equal to or less than $2/7$.

CONCLUSION

Figure 10:
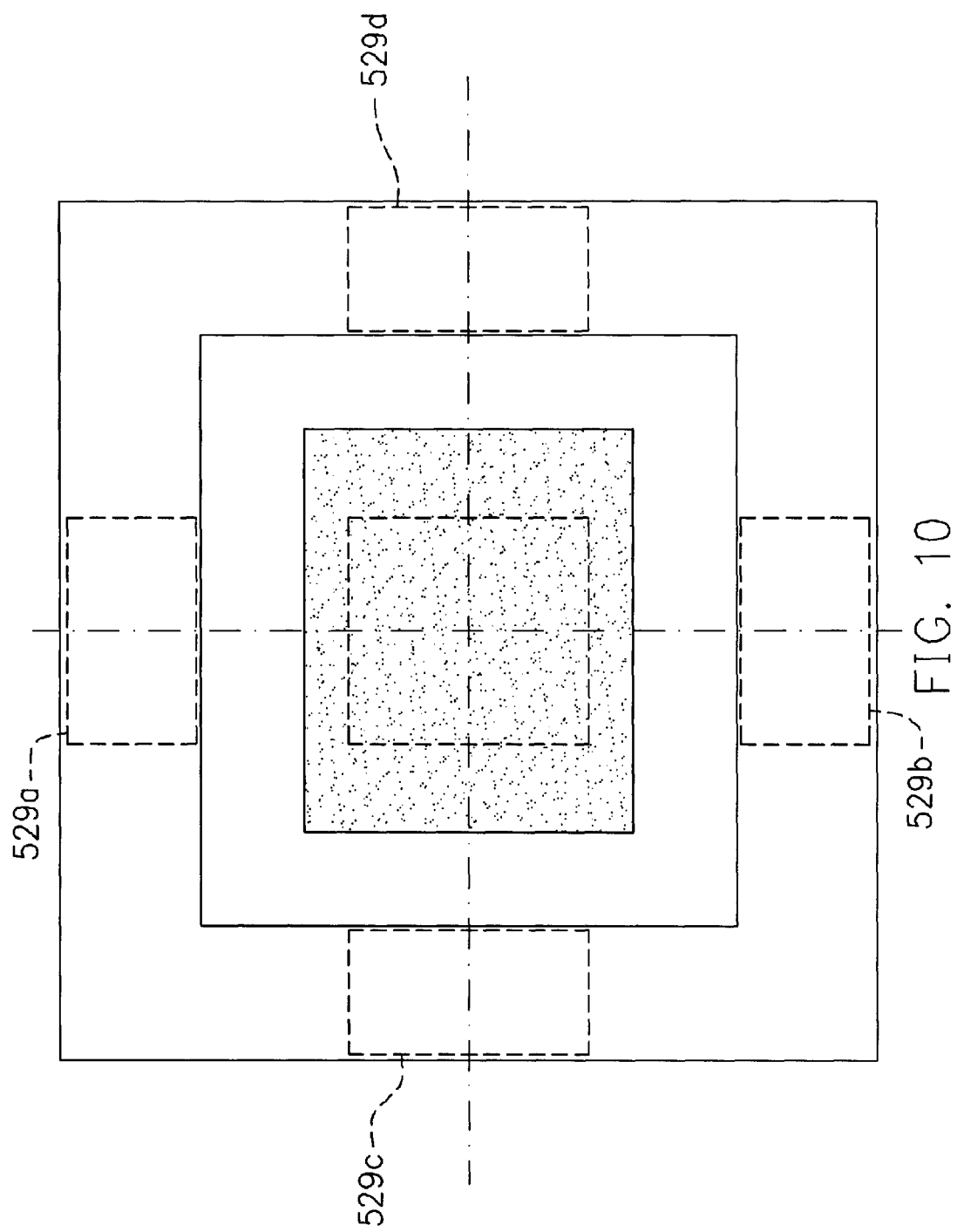
FIG. 10 schematically shows a layout diagram of the substrate connection pads according to the present invention.

FIG. 10 schematically shows a layout diagram of the substrate connection pads according to the present invention. In practical application, in any of the centerline neighboring region 529a, 529b, 529c, 529d, there can be the central connection pads arranged as shown in the first preferred embodiment or in the second preferred embodiment. Optionally, the layout of the central connection pads in the first preferred embodiment can be mixed with the layout of the central connection pads in the second preferred embodiment, for example, disposing the layout of the central connection pads in the first preferred embodiment in the first centerline neighboring region 529a and the second centerline neighboring region 529b; and disposing the layout of the central connection pads in the second preferred embodiment in the third centerline neighboring region 529c and the fourth centerline neighboring region 529d; or for example, disposing the layout of the central connection pads in the first preferred embodiment in the first centerline neighboring region 529a and the third centerline neighboring region 529c, and disposing the layout of the central connection pads in the second preferred embodiment in the second centerline neighboring region 529b and the fourth centerline neighboring region 529d.

Further, in the first preferred embodiment and the second preferred embodiment mentioned above, in the first centerline neighboring region and the second centerline neighboring region, there are three first central connection pads and three second central connection pads in each row, which is in parallel to the first centerline. However, the practical application is not necessarily limited to it. Optionally, the number of the first connection pads and the second connection pads in each row, which is in parallel to the first centerline, may be other numbers, such as two, four, five, six, or even more.

In the first preferred embodiment and the second preferred embodiment mentioned above, in the third centerline neighboring region and the fourth centerline neighboring region, there are. three third central connection pads and three fourth central connection pads in each row, which is in parallel to the second centerline. However, the practical application is not necessarily limited to it. Optionally, the number of the third connection pads and the fourth connection pads in each row, which is in parallel to the second. centerline, may be other numbers, such as two, four, five, six, or even more.

In summary, since the central connection pads for transmitting signals disposed in the centerline neighboring region are relatively few, the multiple traces neighboring the centerline of the chip do. not extend in a rather long distance and parallelly to the centerline. Instead, they only extend parallelly in a short distance and then extend gradually increasing the pitch between the neighboring traces. Therefore, the cross-talk generated between the traces is reduced and the noise generated by signal transmission on the traces is also dramatically diminished.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A flip-chip package substrate, on which a chip shaped as a rectangle is suited to be disposed and to which the chip is suited to be electrically connected, the chip comprising two first opposite sides opposite to each other, two second opposite sides opposite to each other, a first centerline, and a second centerline, the first centerline perpendicularly and evenly dividing the first two opposite sides, the second centerline perpendicularly and evenly dividing the second two opposite sides, the substrate comprising:

a plurality of electrically conductive layers sequentially stacked with each other;

a plurality of isolation layers disposed between two neighboring layers of the electrically conductive layers respectively to electrically isolate the electrically conductive layers; and a plurality of via-hole traces penetrating at least one layer of the isolation layers to electrically connect at least two layers of the electrically conductive layers, wherein the substrate comprises a first surface and a corresponding second surface, the chip is adapted to be disposed on the first surface of the substrate, the substrate further comprises a core connection-pad layout region and a peripheral connection-pad layout region, both of them are disposed on the second surface of the substrate, the peripheral connection-pad layout region surrounds the core connection-pad layout region, and the peripheral connection-pad layout region comprises a first centerline neighboring region, a second centerline neighboring region, a third centerline neighboring region and a fourth centerline neighboring region, the first centerline neighboring region and the second centerline neighboring region are disposed on the substrate at two opposite sides of the chip, the third centerline neighboring region and the fourth centerline neighboring region are disposed on the substrate at the other two opposite sides of the chip, the first centerline traverses the first centerline neighboring region and the second centerline neighboring region, the second centerline traverses the third centerline neighboring region and the fourth centerline neighboring region, the second surface of the substrate comprises a plurality of common padable areas, a plurality of first central padable areas, a plurality of second central padable areas, a plurality of third central padable areas and a plurality of fourth central padable areas, part of the common padable areas are disposed in the core connection-pad layout region, the other part of the common padable areas are disposed in the peripheral connection-pad layout region and far away from the first centerline and the second centerline, the first central padable areas are disposed in the first centerline neighboring region, the second central padable areas are disposed in the second centerline neighboring region, the third central padable areas are disposed in the third centerline neighboring region, and the fourth central padable areas are disposed in the fourth centerline neighboring region, within the first centerline neighboring region, at both sides of the first centerline is respectively lined with the first central padable areas in three rows, the first central padable areas in each row are lined in parallel to the first centerline, the first centerline traverses between the first central padable areas arranged in two neighboring rows, and the ratio of the number of the first central padable areas with the connection pads for transmitting signals to the total number of the first central padable areas is either equal to or less than $2/7$.

2. The flip-chip package substrate of claim 1, wherein within the second centerline neighboring region, at both sides of the first centerline is respectively lined with the second central padable areas in three rows, the second central padable areas in each row are lined in parallel to the first centerline, the first centerline traverses between the second central padable areas arranged in two neighboring rows, and the ratio of the number of the second central padable areas with the connection pads for transmitting signals to the total number of the second central padable areas is either equal to or less than $2/7$.

3. The flip-chip package substrate of claim 1, wherein within the second centerline neighboring region is lined with the second central padable areas in five rows, the second central padable areas in each row are lined in parallel to the first centerline, the first centerline traverses the second central padable areas arranged in a central row, and the ratio of the number of the second central padable areas with the connection pads for transmitting signals to the total number of the second central padable areas is either equal to or less than $2/7$.

4. The flip-chip package substrate of claim 1, wherein within the third centerline neighboring region, at both sides of the second centerline is respectively lined with the third central padable areas in three rows, the third central padable areas in each row are lined in parallel to the second centerline, and the second centerline traverses between the third central padable areas arranged in two neighboring rows, the ratio of the number of the third central padable areas with the connection pads for transmitting signals to the tot number of the third central padable areas is either equal to or less than $2/7$.

5. The flip-chip package substrate of claim 1, wherein within the third centerline neighboring region is lined with the third central padable areas in five rows, the third central padable areas in each row are lined in parallel to the second centerline, the second centerline traverses the third central padable areas arranged in a central row, the ratio of the number of the third central padable areas with the connection pads for transmitting signals to the total number of the third central padable areas is either equal to or less than $2/7$.

6. The flip-chip package substrate of claim 1, wherein within the second centerline neighboring region, at both sides of the first centerline is respectively lined with the second central padable areas in three rows, the second central padable areas in each row are lined in parallel to the first centerline, the first centerline traverses between the second central padable areas arranged in two neighboring rows, the ratio of the number of the second central padable areas with the connection pads for transmitting signals to the total number of the second central padable areas is either equal to or less than $2/7$, within the third centerline neighboring region, at both sides of the second centerline is respectively lined with the third central padable areas in three rows, the third central padable areas in each row are lined in parallel to the second centerline, the second centerline traverses between the third central padable areas arranged in two neighboring rows, the ratio of the number of the third central padable areas with the connection pads for transmitting signals to the total number of the third central padable areas is either equal to or less than $2/7$, within the fourth centerline neighboring region, at both sides of the second centerline is respectively lined with the fourth central padable areas in three rows, the fourth central padable areas in each row are lined in parallel to the second centerline, the second centerline traverses between the fourth central padable areas arranged in two neighboring rows, and the ratio of the number of the fourth central padable areas with the connection pads for transmitting signals to the total number of the fourth central padable areas is either equal to or less than $2/7$.

7. The flip-chip package substrate of claim 1, wherein within the second centerline neighboring region, at both sides of the first centerline is respectively lined with the second central padable areas in three rows, the second central padable areas in each row are lined in parallel to the first centerline, the first centerline traverses between the second central padable areas arranged in two neighboring rows, the ratio of the number of the second central padable areas with the connection pads for transmitting signals to the total number of the second central padable areas is either equal to or less than $2/7$, within the third centerline neighboring region is lined with the third central padable areas in five rows, the third central padable areas in each row are lined in parallel to the second centerline, the second centerline traverses the third central padable areas arranged in a central row, the ratio of the number of the third central padable areas with the connection pads for transmitting signals to the total number of the third central padable areas is either equal to or less than $2/7$, within the fourth centerline neighboring region is lined with the fourth central padable areas in five rows, the fourth central padable areas in each row are lined in parallel to the second centerline, the second centerline traverses the fourth central padable areas arranged in a central row, and the ratio of the number of the fourth central padable areas with the connection pads for transmitting signals to the total number of the fourth central padable areas is either equal to or less than $2/7$.

8. The flip-chip package substrate of claim 1, wherein the core connection-pad-layout region is contiguous to the peripheral connection-pad layout region.

9. The flip-chip package substrate of claim 1, wherein the core connection-pad layout region is apart from the peripheral connection-pad layout region in a certain distance.

10. The flip-chip package substrate of claim 1, wherein all of the first central padable areas are defined by a plurality of connection pads of the substrate.

11. The flip-chip package substrate of claim 1, wherein there are no connection pads at one or more of the first central padable areas.

12. A flip-chip package substrate, on which a chip shaped as a rectangle is suited to be disposed and to which the chip is suited to be electrically connected, the chip comprising two first opposite sides opposite to each other, two second opposite sides opposite to each other, a first centerline, and a second centerline, the first centerline perpendicularly and evenly dividing the first two opposite sides, the second centerline perpendicularly and evenly dividing the second two opposite sides, the substrate comprising:

a plurality of electrically conductive layers sequentially stacked with each other;

a plurality of isolation layers disposed between two neighboring layers of the electrically conductive layers respectively to electrically isolate the electrically conductive layers; and a plurality of via-hole traces penetrating at least one layer of the isolation layers to electrically connect at least two layers of the electrically conductive layers, wherein the substrate comprises a first surface and a corresponding second surface, the chip is adapted to be disposed on the first surface of the substrate, the substrate further comprises a core connection-pad layout region and a peripheral connection-pad layout region, both of them are disposed on the second surface of the substrate, the peripheral connection-pad layout region surrounds the core connection-pad layout region, and the peripheral connection-pad layout region comprises a first centerline neighboring region, a second centerline neighboring region, a third centerline neighboring region and a fourth centerline neighboring region, the first centerline neighboring region and the second centerline neighboring region are disposed on the substrate at two opposite sides of the chip, the third centerline neighboring region and the fourth centerline neighboring region are disposed on the substrate at the other two opposite sides of the chip, the first centerline traverses the first centerline neighboring region and the second centerline neighboring region, the second centerline traverses the third centerline neighboring region and the fourth centerline neighboring region, the electrically conductive layer nearest to the second surface of the substrate comprises a plurality of common padable areas, a plurality of first central padable areas, a plurality of second central padable areas, a plurality of third central padable areas and a plurality of fourth central padable areas, part of the common padable areas are disposed in the core connection-pad layout region, the other part of the common padable areas are disposed in the peripheral connection-pad layout region and far away from the first centerline and the second centerline, the first central padable areas are disposed in the first centerline neighboring region, the second central padable areas are disposed in the second centerline neighboring region, the third central padable areas are disposed in the third centerline neighboring region, and the fourth central padable areas are disposed in the fourth centerline neighboring region, within the first centerline neighboring region is lined with the first central padable areas in five rows, the first central padable areas are lined in parallel to the first centerline, the first centerline traverses the first central padable areas arranged in a central row, and the ratio of the number of the first central padable areas with the connection pads for transmitting signals to the total number of the first central padable areas is either equal to or less than $2/7$.

13. The flip-chip package substrate of claim 12, within the second centerline neighboring region are lined with the second central padable areas in five rows, the second central padable areas in each row are lined in parallel to the first centerline, and the first centerline traverses the second central padable areas arranged in a central row, and the ratio of the number of the second central padable areas with the connection pads for transmitting signals to the total number of the second central padable areas is either equal to or less than $2/7$.

14. The flip-chip package substrate of claim 12, within the third centerline neighboring region is lined with the second central padable areas in five rows, the third central padable areas in each row are lined in parallel to the second centerline, the second centerline traverses the third central padable areas arranged in a central row, and the ratio of the number of the third central padable areas with the connection pads for transmitting signals to the total number of the third central padable areas is either equal to or less than $2/7$.

15. The flip-chip package substrate of claim 12, within the second centerline neighboring region is lined with the second central padable areas in five rows, the second central padable areas in each row are lined in parallel to the first centerline, the first centerline traverses the second central padable areas arranged in a central row, the ratio of the number of the second central padable areas with the connection pads for transmitting signals to the total number of the second central padable areas is less than $2/7$, within the third centerline neighboring region is lined with the third central padable areas in five rows, the third central padable areas are lined in parallel to the second centerline, the second centerline traverses the third central padable areas arranged in a central row, the ratio of the number of the third central padable areas with the connection pads for transmitting signals to the total number of the third central padable areas is either equal to or less than $2/7$, within the fourth centerline neighboring region is lined with the fourth central padable areas in five rows, the fourth central padable areas in each row are lined in parallel to the second centerline, the second centerline traverses the fourth central padable areas arranged in a central row, and the ratio of the number of the fourth central padable areas with the connection pads for transmitting signals to the total number of the fourth central padable areas is either equal to or less than $2/7$.

16. The flip-chip package substrate of claim 12, wherein the core connection-pad layout region is contiguous to the peripheral connection-pad layout region.

17. The flip-chip package substrate of claim 12, wherein the core connection-pad layout region is apart from the peripheral connection-pad layout region in a certain distance.

18. The flip-chip package substrate of claim 12, wherein all of the first central padable areas are defined by a plurality of connection pads of the substrate.

19. The flip-chip package substrate of claim 12, wherein there are no connection pads at one or more of the first central padable areas.

20. A flip-chip package substrate having a first surface and a corresponding second surface, a chip adapted to be disposed on the first surface of the substrate and to be electrically connected to the substrate, the chip having a centerline evenly dividing the chip, the substrate further having a peripheral connection-pad layout region disposed on the second surface, the peripheral connection-pad layout region having a centerline neighboring region which the centerline traverses, the substrate comprising:

a plurality of central padable areas disposed in the centerline neighboring region, wherein within the centerline neighboring region, at both sides of the centerline are respectively lined with the central padable areas in three rows, the central padable areas in each row are lined in parallel to the centerline, and the centerline traverses between the central padable areas arranged in two neighboring rows, and the ratio of the number of the central padable areas with the connection pads for transmitting signals to the total number of the central padable areas is either equal to or less than $2/7$.

21. The flip-chip package substrate of claim 20, wherein all of the central padable areas are defined by a plurality of connection pads of the substrate.

22. The flip-chip package substrate of claim 20, wherein there are no connection pads at one or more of the central padable areas.

23. A flip-chip package substrate having a first surface and a corresponding second surface, a chip adapted to be disposed on the first surface of the substrate and to be electrically connected to the substrate, the chip having a centerline evenly dividing the chip, the substrate further having a peripheral connection-pad layout region disposed on the second surface, the peripheral connection-pad layout region having a centerline neighboring region which the centerline traverses, the substrate comprising:

a plurality of central padable areas disposed in the centerline neighboring region, wherein within the centerline neighboring region is lined with the central padable areas in five rows, the central padable areas in each row are lined in parallel to the centerline, the centerline traverses the central padable areas arranged in a central row, and the ratio of the number of the central padable areas with the connection pads for transmitting signals to the total number of the central padable areas is either equal to or less than $2/7$.

24. The flip-chip package substrate of claim 23, wherein all of the central padable areas are defined by a plurality of connection pads of the substrate.

25. The flip-chip package substrate of claim 23, wherein there are no connection pads at one or more of the central padable areas.

* * * * *